United States Patent
Ogiso

(10) Patent No.: US 6,423,245 B1
(45) Date of Patent: Jul. 23, 2002

(54) PIEZOELECTRIC CERAMIC COMPOSITION FOR SURFACE ACOUSTIC WAVE DEVICE AND SURFACE ACOUSTIC WAVE DEVICE

(75) Inventor: Koji Ogiso, Moriyama (JP)

(73) Assignee: Murata Manufacturing Co. Ltd (JP)

( * ) Notice: Subject to any disclaimer, the term of this patent is extended or adjusted under 35 U.S.C. 154(b) by 0 days.

(21) Appl. No.: 09/935,959

(22) Filed: Aug. 23, 2001

(30) Foreign Application Priority Data

Aug. 31, 2000 (JP) ........................................ 2000-262974
Jul. 10, 2001 (JP) ........................................ 2001-209561

(51) Int. Cl.$^7$ ........................ C04B 35/01; H01L 41/08; H04R 17/00
(52) U.S. Cl. ........................ 252/62.9 PZ; 310/313 R; 367/157; 367/180
(58) Field of Search .............. 252/62.9 PZ; 310/313 R; 367/157, 180

(56) References Cited

U.S. PATENT DOCUMENTS 6,123,867 A * 9/2000 Takahashi et al. .... 252/62.9 PZ

FOREIGN PATENT DOCUMENTS

| JP | 04331772 | * 11/1992 |
| JP | 05221717 | * 8/1993 |
| JP | 08091928 | * 4/1996 |

* cited by examiner

Primary Examiner—Mark Kopec
(74) Attorney, Agent, or Firm—Dickstein Shapiro Morin & Oshinsky, LLP

(57) ABSTRACT

A piezoelectric ceramic composition for a surface acoustic wave device which can improve the electromechanical coupling coefficient is provided. The piezoelectric ceramic composition for a surface acoustic wave device is represented by the formula $Pb_a Zr_x Ti_y (Ni_m Mn_n Nb_{2/3})_z O_3$, wherein $x+y+z=1$, $0.93 \leq a \leq 1.02$, $0.32 \leq x \leq 0.50$, $0.41 \leq y \leq 0.54$, $0.03 \leq z \leq 0.21$ and $0.24 \leq m+n \leq 0.67$.

20 Claims, 1 Drawing Sheet

PIEZOELECTRIC CERAMIC COMPOSITION FOR SURFACE ACOUSTIC WAVE DEVICE AND SURFACE ACOUSTIC WAVE DEVICE

BACKGROUND OF THE INVENTION

1. Field of the Invention

The present invention relates to a piezoelectric ceramic composition used for a surface acoustic wave device. In particular, the present invention relates to a piezoelectric ceramic composition for a surface acoustic wave device which can improve the impedance ratio and coupling coefficient and such a surface acoustic wave device.

2. Description of the Related Art

In recent years, accompanying the progress of mobile communication equipment using high frequencies, components used therein, for example, resonators and filters, have also been required for use in higher frequencies and miniaturization. As the resonators and the filters, surface acoustic wave devices have been used because of advantages in acceleration of use in higher frequencies and miniaturization.

In a surface acoustic wave device, an interdigital transducer (IDT) composed of at least one pair of interdigital electrodes is configured on a piezoelectric substrate, and excitation and reception of the surface acoustic wave are performed by the IDT. As a piezoelectric substrate material of the surface acoustic wave device, a piezoelectric single crystal of, for example, $LiTaO_3$ and $LiNbO_3$, or a piezoelectric ceramic primarily composed of $PbTiO_3$, $Pb(Ti,Zr)O_3$, etc., are used. A laminate in which piezoelectric thin films, such as ZnO thin films, are laminated on an insulation substrate or a piezoelectric substrate is also used as the piezoelectric substrate of the surface acoustic wave device.

When comparisons are made between the piezoelectric single crystal and the piezoelectric ceramic, the speed of sound is lower in the piezoelectric ceramic. Therefore, a piezoelectric substrate made of piezoelectric ceramic is preferable in order to miniaturize the surface acoustic wave device.

Coupling coefficients required of piezoelectric substrate materials are different depending on the intended purposes, although regarding the piezoelectric single crystal, the coupling coefficient is uniquely defined based on the kind and the cut angle. That is, for a surface acoustic wave device using the piezoelectric single crystal, the piezoelectric characteristics and temperature characteristics are uniquely defined based on the kind of the single crystal and the cut angle, so that flexibility in design of devices is reduced.

On the other hand, piezoelectric ceramics, such as $Pb(Ti,Zr)O_3$-based ceramics, have piezoelectric characteristics which can be varied over a wide range by controlling the composition.

However, when the piezoelectric ceramics were used as the piezoelectric substrates of the surface acoustic wave devices in high frequency regions exceeding 10 MHZ, there was a problem in that impedance ratios, that is, the ratios of the impedance at an anti-resonant frequency of Fa to the impedance at a resonant frequency of Fr, are small.

SUMMARY OF THE INVENTION

Accordingly, it is an object of the present invention to provide a piezoelectric ceramic composition for a surface acoustic wave device which can achieve a high impedance ratio even in high frequency regions.

The piezoelectric ceramic composition for a surface acoustic wave device is represented by a formula $Pb_aZr_xTi_y(Ni_mMn_nNb_{2/3})_zO_3$, where:

$x+y+z=1$;

$0.93 \leq a \leq 1.02$;

$0.32 \leq x \leq 0.50$;

$0.41 \leq y \leq 0.54$;

$0.03 \leq z \leq 0.21$; and $0.24 \leq m+n \leq 0.67$.

Preferably, m and n fall within the ranges of:

$0.46 \leq m+n \leq 0.67$;

$0.01 \leq m \leq 0.66$; and $0.01 \leq n \leq 0.66$.

In the piezoelectric ceramic composition for a surface acoustic wave device, at least one element selected from the group consisting of Ba, Ca, and Sr may be substituted for a part of said Pb.

By sintering the piezoelectric ceramic composition, a piezoelectric ceramic suitable for a piezoelectric substrate of a surface acoustic wave device is obtained. The surface acoustic wave device preferably utilizes a SH type surface acoustic wave. In the case, it is preferable that a grain diameter is about 3 µm or less and the sizes of pores and defects in the piezoelectric ceramic are about 3 µm or less. Further, it is preferable that the absolute value of a change rate of resonant frequency with respect to temperature is about 100 ppm/°C. or less.

By using the piezoelectric ceramic composition for a surface acoustic wave device according to the present invention, excellent impedance ratios can be achieved, higher frequencies can be used and the piezoelectric characteristics can be controlled over a wide range.

Therefore, a surface acoustic wave device which meets use requirements in higher frequencies and miniaturization can be provided with ease according to the present invention.

When m+n is 0.46 or more, but 0.67 or less, m is 0.01 or more but 0.66 or less, and n is 0.01 or more but 0.66 or less, a large electromechanical coupling coefficient can be achieved.

Furthermore, when the crystalline particle diameter is about 3 µm or less, and when sizes of the pores and defects in the sintered material are about 3 µm or less, the impedance ratio can be further improved.

DESCRIPTION OF THE PREFERRED EMBODIMENTS

Figure 1:
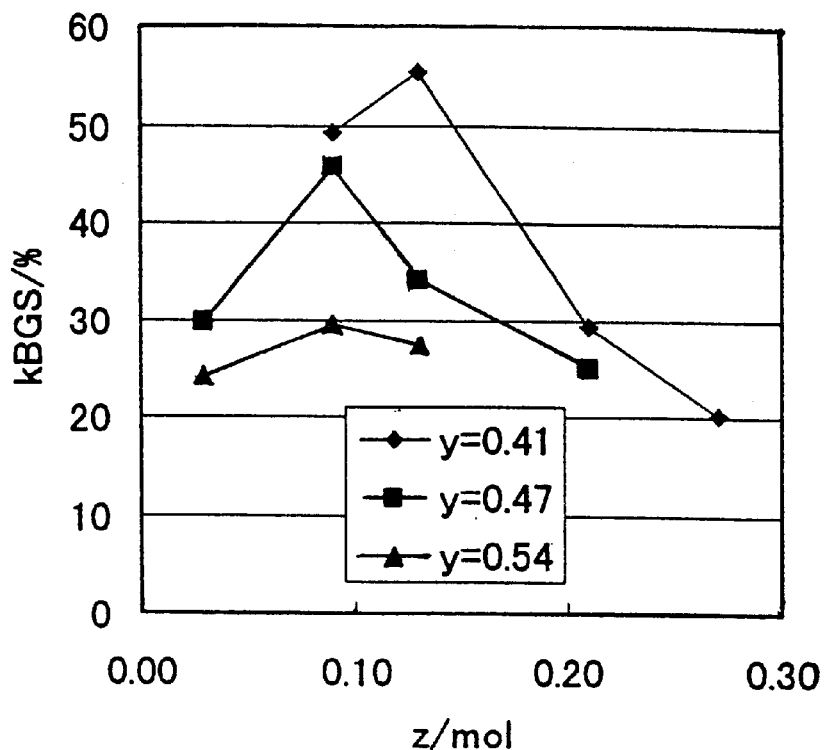
FIG. 1 is a graph showing changes of the electromechanical coupling coefficient kBGS with changes of z.

The present invention will be explained below in further detail using specified examples according to the present invention.

A piezoelectric ceramic composition for a surface acoustic wave device, of the present invention is represented by a formula $Pb_aZr_xTi_y(Ni_mMn_nNb_{2/3})_zO_3$, wherein $x+y+z=1$, $0.93 \leq a \leq 1.02$, $0.32 \leq x \leq 0.50$, $0.41 \leq y \leq 0.54$, $0.03 \leq z \leq 0.21$, and $0.24 \leq m+n \leq 0.67$.

The inventors of the present invention have discovered that a piezoelectric ceramic composition composed of at least Pb, Ni, Mn, Nb, Ti, Zr, and O and satisfying the aforementioned formula can improve the aforementioned impedance ratio could be effectively improved in a surface acoustic wave device using the aforementioned piezoelectric ceramic composition as a piezoelectric substrate.

The piezoelectric ceramic composition according to the present invention is composed of oxides or carbonates of the elements, as primary materials, indicated by the aforementioned formula, although that may be composed of metals, other compounds or complex oxides thereof as materials. Each material may contain impurities, although these have little influence as long as the purity is equivalent to or more than that of first class grade chemicals. Furthermore, $Al_2O_3$ and $SiO_2$ may be admixed therewith during manufacture, and degradation of piezoelectric characteristics does not occur by a great degree as long as the concentrations of these impurities are and 1,000 ppm or less.

In the present invention, when a is less than 0.93 or exceeds 1.02, sinterability is degraded so that a sintered material having sufficient strength cannot be produced due to inferior sinterability.

When x is less than 0.32 or exceeds 0.50, the impedance ratio and the electromechanical coupling coefficient are reduced. Likewise, when y is less than 0.41, although the impedance ratio is high, the heat resistance is remarkably degraded. When y exceeds 0.54, the electromechanical coupling coefficient and the impedance ratio are reduced. Likewise, when z is less than 0.03, or exceeds 0.21, the impedance ratio and the electromechanical coupling coefficient are reduced.

In addition, when m+n is 0.24 or less or exceeds 0.67, the sinterability is inferior, and many different phases are present, so that desired sintered material may not be produced.

In particular, when m+n is 0.46 or more but 0.67 or less, m is 0.01 to 0.66, and n is 0.01 to 0.66, the electromechanical coupling coefficient can be effectively improved, so that this case is preferable.

The piezoelectric ceramic obtained by sintering the piezoelectric ceramic composition comprises as a primary component an oxide having a perovskite structure. At least one element selected from the group consisting of Ba, Ca and Sr may substitute for Pb constituting A site of the perovskite structure, and in such a case, degradation of the piezoelectric characteristics is not likely to occur. Herein, the rate of substitution of Pb element by Sr, Ba or Ca in the piezoelectric ceramic composition is preferably specified to be within the range of about 10% by mol or less of Pb.

Preferably, in the piezoelectric ceramic obtained by sintering the piezoelectric ceramic composition, a grain size is specified to be about 3 $\mu$m or less.

Furthermore, the sizes of pores and defects formed in the piezoelectric ceramic are preferably specified to be about 3 $\mu$m or less.

In a specified piezoelectric ceramic according to of the present invention, the absolute value of a change rate of resonant frequency with respect to temperature is preferably specified to be about 100 ppm/°C. or less.

The piezoelectric ceramic according to the present invention is suitably used for a surface acoustic wave device using a SH type surface acoustic wave. When the SH type surface wave is used, the surface acoustic wave device can be further miniaturized compared to a surface acoustic wave device using a Rayleigh wave.

Hereinafter preferred embodiments of the present invention will be described in more detail.

As materials, powders of $Pb_3O_4$, NiO, $MnCO_3$, $Nb_2O_3$, $TiO_2$ and $ZrO_2$ was prepared. These powders were weighed in order to have each of compositions as shown in the following Table 1 to Table 5, and after addition of water, wet mixing was performed with a ball mill so as to produce slurry.

The resulting slurry was dehydrated, and the resulting mixed powder was dried with an oven and was subjected to particle sizing, thereby obtaining a piezoelectric ceramic composition.

Subsequently, sized mixed powder was put in a box made of alumina, and was calcined at a temperature of 800° C. to 1,000° C. so as to produce a calcined material.

A binder and a dispersing agent were added to the aforementioned calcined material, and these were wet-mixed with a ball mill so as to produce a second slurry. The second slurry was poured into a mold having the plan shape of a square, and cast molding was performed. The resulting square plate-like molding was degreased at 300° C. to 600° C., and thereafter, was baked at 1,000° C. to 1,300° C. in an atmosphere of oxygen so as to produce a sintered piezoelectric ceramic.

The surface of the resulting sintered piezoelectric ceramic was finished by lapping so as to produce a piezoelectric substrate of 5 cm by 5 cm having a thickness of 0.4 mm to 0.8 mm.

Polarization electrodes were formed on the piezoelectric substrate produced as described above, and polarization was performed at 100° C. in oil with field intensity of 3kV/mm. Thereafter, aging was performed at a temperature of 200° C. for 1 hour.

Figure 2:
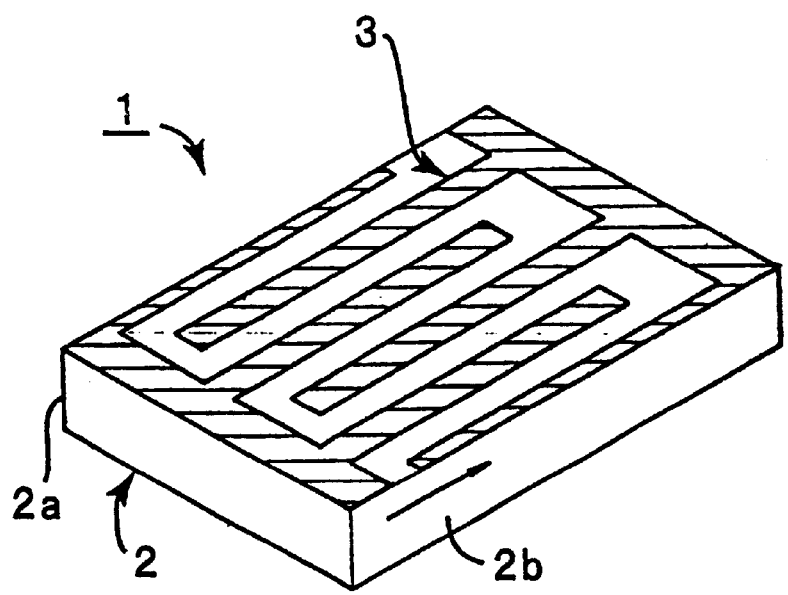
FIG. 2 is a perspective view of an end face reflection type surface acoustic wave device prepared according to an embodiment of the present invention.

A plurality of IDTs were formed on the aged piezoelectric substrate by photolithography, and each of surface acoustic wave devices was cut from the resulting piezoelectric substrate. The surface acoustic wave device produced as described above is shown in FIG. 2.

In the surface acoustic wave device 1, an interdigital transducer (IDTs) 3 is formed on a piezoelectric substrate 2 made of the aforementioned piezoelectric ceramic composition. The outermost electrode fingers of IDTs 3 are flush with edges made by end faces 2a and 2b and the top face of the piezoelectric substrate 2. The surface acoustic wave device 1 is an end face reflection type surface wave resonator using a BGS wave as a SH type surface wave. A reflector is not necessary here because of the end face reflection type. Therefore, miniaturization can be planned.

In the production of the aforementioned surface acoustic wave device 1, the compositions of the materials were variously varied as described above so as to produce surface acoustic wave devices of Sample Nos. 1 to 78. Subsequently, the electromechanical coupling coefficients kBGS (%) of BGS wave, impedance ratios ATT (dB), and change rates of resonant frequency with respect to temperature (ppm/°C.) were measured. Furthermore, the particle diameter in each of the piezoelectric substrates was determined by SEM observation. The results thereof are shown in FIG. 1 and Table 1 to Table 5. Samples outside the scope of the invention are indicated by an asterisk (*).

TABLE 1

| No. | a (mol) | m (mol) | n (mol) | x (mol) | y (mol) | z (mol) | kBGS (%) | ATT (dB) | particle diameter (μm) | fr-TC (ppm/° C.) |
|---|---|---|---|---|---|---|---|---|---|---|
| 1 | 1.000 | 0.167 | 0.167 | 0.500 | 0.470 | 0.030 | 29.6 | 41.6 | 3.0 | 42 |
| 2* | 1.000 | 0.167 | 0.167 | 0.370 | 0.600 | 0.030 | 17.2 | 28.6 | 3.5 | −27 |
| 3 | 1.000 | 0.167 | 0.167 | 0.485 | 0.465 | 0.050 | 34.8 | 52.3 | 1.5 | 51 |
| 4 | 1.000 | 0.167 | 0.167 | 0.488 | 0.463 | 0.050 | 40.7 | 53.3 | 1.6 | −73 |
| 5 | 1.000 | 0.167 | 0.167 | 0.490 | 0.460 | 0.050 | 43.1 | 58.3 | 1.4 | −122 |
| 6 | 1.000 | 0.167 | 0.167 | 0.410 | 0.530 | 0.060 | 24.8 | 49.5 | 1.7 | 103 |
| 7 | 1.000 | 0.167 | 0.167 | 0.400 | 0.540 | 0.060 | 23.7 | 47.3 | 1.5 | −32 |
| 8* | 1.000 | 0.167 | 0.167 | 0.390 | 0.550 | 0.060 | 22.1 | 39.5 | 1.7 | −29 |
| 9 | 1.000 | 0.156 | 0.177 | 0.482 | 0.451 | 0.067 | 34.2 | 41.5 | 2.9 | 34 |
| 10 | 1.000 | 0.155 | 0.178 | 0.472 | 0.450 | 0.078 | 48.1 | 48.2 | 2.5 | 153 |
| 11 | 1.000 | 0.167 | 0.167 | 0.470 | 0.450 | 0.080 | 43.3 | 42.5 | 3.8 | 170 |
| 12 | 1.000 | 0.156 | 0.177 | 0.467 | 0.449 | 0.084 | 53.3 | 52.0 | 2.4 | 184 |
| 13 | 1.000 | 0.167 | 0.167 | 0.500 | 0.410 | 0.090 | 49.2 | 52.4 | 2.0 | −100 |
| 14 | 1.000 | 0.167 | 0.167 | 0.440 | 0.470 | 0.090 | 45.9 | 49.8 | 2.1 | 79 |
| 15 | 1.000 | 0.167 | 0.167 | 0.370 | 0.540 | 0.090 | 29.5 | 43.5 | 2.2 | 15 |
| 16 | 1.000 | 0.156 | 0.178 | 0.462 | 0.448 | 0.090 | 54.5 | 54.3 | 2.1 | 98 |
| 17 | 1.000 | 0.156 | 0.178 | 0.463 | 0.447 | 0.090 | 59.3 | 53.2 | 2.3 | 80 |
| 18 | 1.000 | 0.156 | 0.178 | 0.462 | 0.448 | 0.090 | 56.7 | 56.4 | 2.2 | 124 |

TABLE 2

| No. | a (mol) | m (mol) | n (mol) | x (mol) | y (mol) | z (mol) | kBGS (%) | ATT (dB) | particle diameter (μm) | fr-TC (ppm/° C.) |
|---|---|---|---|---|---|---|---|---|---|---|
| 19* | 1.000 | 0.167 | 0.167 | 0.500 | 0.370 | 0.130 | 40.2 | 43.5 | 2.1 | −301 |
| 20 | 1.000 | 0.167 | 0.167 | 0.460 | 0.410 | 0.130 | 55.3 | 50.8 | 2.2 | −50 |
| 21 | 1.000 | 0.167 | 0.167 | 0.400 | 0.470 | 0.130 | 34.2 | 48.9 | 2.0 | 39 |
| 22 | 1.000 | 0.167 | 0.167 | 0.330 | 0.540 | 0.130 | 27.4 | 44.3 | 2.0 | −20 |
| 23 | 1.000 | 0.156 | 0.178 | 0.418 | 0.442 | 0.140 | 43.4 | 51.2 | 2.0 | −19 |
| 24 | 1.000 | 0.156 | 0.178 | 0.380 | 0.480 | 0.140 | 30.0 | 49.4 | 2.1 | 21 |
| 25 | 1.000 | 0.156 | 0.177 | 0.386 | 0.441 | 0.173 | 33.0 | 46.7 | 2.4 | 15 |
| 26 | 1.000 | 0.156 | 0.178 | 0.380 | 0.440 | 0.180 | 32.3 | 45.9 | 2.0 | 22 |
| 27 | 1.000 | 0.156 | 0.178 | 0.370 | 0.450 | 0.180 | 32.7 | 50.8 | 2.6 | 51 |
| 28 | 1.000 | 0.156 | 0.178 | 0.390 | 0.430 | 0.180 | 37.1 | 51.0 | 2.2 | −91 |
| 29 | 1.000 | 0.156 | 0.178 | 0.360 | 0.460 | 0.180 | 26.4 | 45.7 | 2.1 | −12 |
| 30 | 1.000 | 0.156 | 0.178 | 0.350 | 0.450 | 0.200 | 27.1 | 46.5 | 2.3 | −16 |
| 31 | 1.000 | 0.167 | 0.167 | 0.380 | 0.410 | 0.210 | 29.2 | 45.8 | 1.9 | −31 |
| 32 | 1.000 | 0.167 | 0.167 | 0.320 | 0.470 | 0.210 | 25.0 | 41.9 | 2.0 | 21 |
| 33* | 1.000 | 0.156 | 0.178 | 0.330 | 0.450 | 0.220 | 23.3 | 39.4 | 3.2 | −32 |
| 34* | 1.000 | 0.167 | 0.167 | 0.320 | 0.410 | 0.270 | 20.3 | 36.3 | 1.8 | −30 |
| 35* | 1.000 | 0.167 | 0.167 | 0.440 | 0.540 | 0.020 | 11.7 | 21.5 | 3.2 | 81 |
| 36 | 1.000 | 0.156 | 0.177 | 0.500 | 0.470 | 0.030 | 31.6 | 45.1 | 2.7 | 40 |
| 37 | 1.000 | 0.156 | 0.177 | 0.430 | 0.540 | 0.030 | 28.3 | 43.8 | 2.6 | 28 |
| 38 | 1.000 | 0.167 | 0.167 | 0.470 | 0.450 | 0.080 | 44.3 | 49.1 | 2.1 | 127 |

TABLE 3

| No. | a (mol) | m (mol) | n (mol) | x (mol) | y (mol) | z (mol) | kBGS (%) | ATT (dB) | particle diameter (μm) | fr-TC (ppm/° C.) |
|---|---|---|---|---|---|---|---|---|---|---|
| 39 | 0.980 | 0.292 | 0.334 | 0.488 | 0.463 | 0.050 | 58.1 | 54.1 | 1.6 | −30 |
| 40 | 1.000 | 0.292 | 0.334 | 0.488 | 0.463 | 0.050 | 60.8 | 56.7 | 1.6 | −53 |
| 41 | 1.020 | 0.292 | 0.334 | 0.488 | 0.463 | 0.050 | 59.0 | 55.3 | 1.5 | −81 |
| 42 | 0.960 | 0.155 | 0.178 | 0.472 | 0.450 | 0.078 | 37.5 | 46.0 | 2.2 | 245 |
| 43 | 0.980 | 0.155 | 0.178 | 0.472 | 0.450 | 0.078 | 46.3 | 48.9 | 2.7 | 220 |
| 44 | 1.000 | 0.155 | 0.178 | 0.472 | 0.450 | 0.078 | 48.1 | 48.2 | 2.5 | 153 |
| 45 | 0.980 | 0.156 | 0.178 | 0.463 | 0.447 | 0.090 | 50.1 | 51.5 | 2.1 | 259 |
| 46 | 1.000 | 0.156 | 0.178 | 0.463 | 0.447 | 0.090 | 59.3 | 53.2 | 2.3 | 80 |
| 47 | 1.010 | 0.156 | 0.178 | 0.463 | 0.447 | 0.090 | 54.4 | 53.3 | 2.0 | 79 |
| 48 | 1.020 | 0.156 | 0.178 | 0.463 | 0.447 | 0.090 | 51.5 | 51.7 | 2.3 | 136 |
| 49 | 0.930 | 0.119 | 0.119 | 0.455 | 0.436 | 0.109 | 35.3 | 45.0 | 2.4 | 84 |
| 50 | 0.950 | 0.119 | 0.119 | 0.455 | 0.436 | 0.109 | 41.0 | 46.6 | 2.0 | 64 |
| 51 | 0.969 | 0.119 | 0.119 | 0.455 | 0.436 | 0.109 | 47.5 | 49.4 | 2.5 | 43 |
| 52 | 1.000 | 0.119 | 0.119 | 0.455 | 0.436 | 0.109 | 49.8 | 51.2 | 2.6 | 21 |
| 53 | 0.980 | 0.156 | 0.178 | 0.380 | 0.440 | 0.180 | 37.8 | 51.3 | 2.2 | 18 |
| 54 | 1.000 | 0.156 | 0.178 | 0.380 | 0.440 | 0.180 | 32.3 | 45.9 | 2.0 | 22 |
| 55 | 0.980 | 0.156 | 0.178 | 0.370 | 0.450 | 0.180 | 32.0 | 49.8 | 2.3 | 27 |
| 56 | 1.000 | 0.156 | 0.178 | 0.370 | 0.450 | 0.180 | 32.7 | 50.8 | 2.6 | 51 |

TABLE 3-continued

| No. | a (mol) | m (mol) | n (mol) | x (mol) | y (mol) | z (mol) | kBGS (%) | ATT (dB) | particle diameter ($\mu$m) | fr-TC (ppm/° C.) |
|---|---|---|---|---|---|---|---|---|---|---|
| 57 | 0.980 | 0.156 | 0.178 | 0.360 | 0.460 | 0.180 | 26.1 | 44.4 | 2.2 | −20 |
| 58 | 1.000 | 0.156 | 0.178 | 0.360 | 0.460 | 0.180 | 26.4 | 45.7 | 2.1 | −12 |

TABLE 4

| No. | a (mol) | m (mol) | n (mol) | x (mol) | y (mol) | z (mol) | kBGS (%) | ATT (dB) | particle diameter ($\mu$m) | fr-TC (ppm/° C.) |
|---|---|---|---|---|---|---|---|---|---|---|
| 59 | 1.000 | 0.656 | 0.010 | 0.490 | 0.470 | 0.040 | 50.9 | 58.0 | 2.2 | 101 |
| 60 | 1.000 | 0.500 | 0.166 | 0.495 | 0.465 | 0.040 | 52.7 | 53.6 | 2.3 | −33 |
| 61 | 1.000 | 0.333 | 0.333 | 0.495 | 0.465 | 0.040 | 53.1 | 58.5 | 2.3 | −40 |
| 62 | 1.000 | 0.160 | 0.500 | 0.495 | 0.465 | 0.040 | 52.0 | 59.0 | 2.4 | −49 |
| 63 | 1.000 | 0.010 | 0.656 | 0.490 | 0.470 | 0.040 | 49.7 | 55.9 | 2.2 | 42 |
| 64 | 1.000 | 0.167 | 0.167 | 0.490 | 0.460 | 0.050 | 43.1 | 58.3 | 1.4 | −122 |
| 65 | 1.000 | 0.292 | 0.334 | 0.490 | 0.460 | 0.050 | 63.5 | 59.3 | 1.5 | −97 |
| 66 | 1.000 | 0.333 | 0.333 | 0.490 | 0.460 | 0.050 | 63.9 | 59.0 | 1.7 | −60 |
| 67 | 1.000 | 0.167 | 0.167 | 0.488 | 0.463 | 0.050 | 40.7 | 53.3 | 1.6 | −73 |
| 68 | 1.000 | 0.230 | 0.230 | 0.488 | 0.463 | 0.050 | 51.5 | 54.1 | 1.8 | −61 |
| 69 | 1.000 | 0.292 | 0.334 | 0.488 | 0.463 | 0.050 | 60.8 | 56.7 | 1.6 | −53 |
| 70 | 1.000 | 0.333 | 0.333 | 0.488 | 0.463 | 0.050 | 61.2 | 57.4 | 1.4 | 40 |
| 71 | 1.000 | 0.167 | 0.167 | 0.485 | 0.465 | 0.050 | 34.8 | 52.3 | 1.5 | 51 |
| 72 | 1.000 | 0.292 | 0.334 | 0.485 | 0.465 | 0.050 | 54.2 | 54.7 | 1.5 | 96 |
| 73 | 1.000 | 0.333 | 0.333 | 0.485 | 0.465 | 0.050 | 56.1 | 55.8 | 1.8 | 104 |
| 74 | 1.000 | 0.119 | 0.119 | 0.470 | 0.450 | 0.080 | 48.5 | 48.1 | 2.2 | 38 |
| 75 | 1.000 | 0.139 | 0.139 | 0.470 | 0.450 | 0.080 | 52.8 | 55.2 | 2.3 | 65 |
| 76* | 1.000 | 0.167 | 0.167 | 0.470 | 0.450 | 0.080 | 38.2 | 38.4 | 3.8 | 170 |

TABLE 5

| No. | a (mol) | m (mol) | n (mol) | x (mol) | y (mol) | z (mol) | Sr (mol) | kBGS (%) | ATT (dB) | particle diameter ($\mu$m) | fr-TC (ppm/° C.) |
|---|---|---|---|---|---|---|---|---|---|---|---|
| 77 | 0.950 | 0.015 | 0.017 | 0.458 | 0.493 | 0.050 | 0.050 | 51.2 | 58.2 | 1.8 | −21 |
| 78 | 0.950 | 0.015 | 0.024 | 0.465 | 0.485 | 0.050 | 0.050 | 44.2 | 55.3 | 2.3 | 36 |

Sample Nos. 1 to 38 in Tables 1 and 2 are examples in which x, y, and z are varied while a=1 and m+n=⅓ in the aforementioned formula. FIG. 1 shows changes of the electromechanical coupling coefficient with changes of y and z in the aforementioned cases.

As is clear from FIG. 1, the electromechanical coupling coefficients vary with changes of z, and reach maximum values in the neighborhood of z=0.1. It is clear that the impedance ratios (ATT) are sufficiently large, 40 dB or more, in the range of 0.03≦z≦0.21. On the other hand, in Sample Nos. 33, 34, and 35, which are out of the range of 0.03 ≦z≦0.21, sinterability is degraded and the impedance ratios are reduced.

When y>0.54, the impedance ratios are reduced, and when y<0.41, the impedance ratios and the electromechanical coupling coefficients are large, although heat resistance is degraded.

Since x satisfies x+y+z=1, if y or z becomes out of the aforementioned preferable range as a result of selection of x, characteristics are degraded.

As is confirmed from the results shown in Tables 1 and 2, the impedance ratios are excellent when x falls within the range of 0.32≦x≦0.50.

In Sample Nos. 39 to 58 as shown in Table 3, the value of a is varied in the range of 0.93 to 1.02, while x, y and z fall within the aforementioned preferable ranges. As is clear from Table 3, the impedance ratios and the electromechanical coupling coefficients are not degraded by a large degree in spite of changes of a. Therefore, it is clear that excellent piezoelectric characteristics can be exhibited when a falls within the range of 0.93≦a≦1.02. When a is out of this range, sinterability is degraded.

Table 4 shows examples of Sample Nos. 59 to 76 in which m and n are varied while x, y, and z fall within the preferable ranges determined from Tables 1 and 2. It is usually believed that the perovskite structure is stable when m+n=⅓. However, it is clear from the results of Sample Nos. 59 to 76 that the impedance ratios become 40 or more when m+n falls within the range of 0.24≦m+n≦0.67, and the impedance ratios are not degraded compared to that in the case where m+n =⅓. In particular, it is clear that when m and n fall within the ranges of 0.46≦m+n≦0.67, 0.01≦m≦0.66 and 0.01≦n≦0.66, the electromechanical coupling coefficients kBGS preferably become very large, e.g., 50.9% or more.

Table 5 shows Sample Nos. 77 and 78 in which Sr was substituted for part of the Pb in the A site. It is clear that high impedance ratios and electromechanical coupling coefficients KBGS can also be achieved in compositions in which Sr is present at the A site.

The impedance ratios are reduced for Sample Nos. 3, 13, and 76 in which particle diameters of the sintered materials exceed about 3 $\mu$m. Therefore, the particle diameter of the sintered material is preferably about 3 μm or less. Regarding defects and pores in the sintered material, effects similar to those in the above description are exhibited, so that, as is assumed from the actions due to the changes of the particle diameter of the sintered material, the defects and pores are also preferably about 3 μm or less.

With the Samples which are within the scope of the present invention, excellent impedance ratios can be achieved and a wide range of electromechanical coupling coefficients KBGS of about 30% to about 50% can be achieved.

In the aforementioned examples, the case where the present invention has been applied to the end face reflection type surface wave device using a SH type surface wave has been explained, although the piezoelectric ceramic composition for a surface acoustic wave device according to the present invention can be used for surface acoustic wave devices using surface waves, such as a Rayleigh wave, other than SH type.

What is claimed is:

1. A piezoelectric ceramic composition for a surface acoustic wave device represented by the formula $A_a Zr_x Ti_y (Ni_m Mn_n Nb_{2/3})_z O_3$, wherein:

$x+y+z=1$;

$0.93 \leq a \leq 1.02$;

$0.32 \leq x \leq 0.50$;

$0.41 \leq y \leq 0.54$;

$0.03 \leq z \leq 0.21$;

$0.24 \leq m+n \leq 0.67$; and wherein A is Pb or the combination of Pb and at least one member of the group consisting of Ba, Ca and Sr.

2. A piezoelectric ceramic composition for a surface acoustic wave device according to claim 1, wherein $0.46 \leq m+n \leq 0.67$;

$0.01 \leq m \leq 0.66$; and $0.01 \leq n \leq 0.66$.

3. A piezoelectric ceramic composition for a surface acoustic wave device according to claim 2, wherein A is Pb.

4. A piezoelectric ceramic composition for a surface acoustic wave device according to claim 2, wherein A is a combination of Pb and at least one member selected from the group consisting of Ba, Ca, and Sr.

5. A piezoelectric ceramic composition for a surface acoustic wave device according to claim 4, wherein said member of the group is Sr.

6. A piezoelectric ceramic comprising a sintered piezoelectric ceramic composition for a surface acoustic wave device according to claim 2.

7. A piezoelectric ceramic according to claim 6, having a grain diameter of about 3 μm or less.

8. A surface acoustic wave device comprising a piezoelectric substrate comprising the piezoelectric ceramic according to claim 6; and an interdigital transducer on the piezoelectric substrate.

9. A surface acoustic wave device according to claim 8, wherein the interdigital transducer is configured to generate a SH type surface acoustic wave on the piezoelectric substrate.

10. A surface acoustic wave device according to claim 9, wherein the piezoelectric substrate has a pair of edges defining a surface on which the interdigital transducer is disposed, and outermost electrode fingers of the interdigital transducer are flush with said edges.

11. A piezoelectric ceramic composition for a surface acoustic wave device according to claim 1, wherein A is Pb.

12. A piezoelectric ceramic composition for a surface acoustic wave device according to claim 1, wherein A is a combination of Pb and at least one member selected from the group consisting of Ba, Ca, and Sr.

13. A piezoelectric ceramic composition for a surface acoustic wave device according to claim 12, wherein said member of the group is Sr.

14. A piezoelectric ceramic comprising a sintered piezoelectric ceramic composition for a surface acoustic wave device according to claim 1.

15. A piezoelectric ceramic according to claim 14, having a grain diameter of about 3 μm or less.

16. A piezoelectric ceramic according to claim 15, wherein the size of pores and defects in the piezoelectric ceramic are about 3 μm or less.

17. A piezoelectric ceramic according to claim 16, wherein the absolute value of the change rate of resonant frequency with respect to temperature is about 100 ppm/°C. or less.

18. A surface acoustic wave device comprising a piezoelectric substrate comprising the piezoelectric ceramic according to claim 14; and an interdigital transducer on the piezoelectric substrate.

19. A surface acoustic wave device according to claim 18, wherein the interdigital transducer is configured to generate a SH type surface acoustic wave on the piezoelectric substrate.

20. A surface acoustic wave device according to claim 19, wherein the piezoelectric substrate has a pair of edges defining a surface on which the interdigital transducer is disposed, and outermost electrode fingers of the interdigital transducer are flush with said edges.

* * * * *